United States Patent
White et al.

(10) Patent No.: US 6,330,184 B1
(45) Date of Patent: Dec. 11, 2001

(54) METHOD OF OPERATING A SEMICONDUCTOR DEVICE

(75) Inventors: Bruce E. White, Round Rock; Bo Jiang; Ramachandran Muralidhar, both of Austin, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/659,105

(22) Filed: Sep. 11, 2000

Related U.S. Application Data

(63) Continuation of application No. 09/495,354, filed on Feb. 1, 2000.

(51) Int. Cl.$^7$ .................................................. G11C 16/04
(52) U.S. Cl. ............................... 365/185.03; 365/185.18; 365/185.28
(58) Field of Search .................. 365/185.03, 185.02, 365/185.18, 185.28, 185.29

(56) References Cited

U.S. PATENT DOCUMENTS

| | | | |
|---|---|---|---|
| 5,408,115 | 4/1995 | Chang | 257/324 |
| 5,714,766 | 2/1998 | Chen et al. | 257/17 |
| 5,740,104 | 4/1998 | Forbes | 365/185.03 |
| 5,852,306 | 12/1998 | Forbes | 257/315 |
| 5,999,444 * | 12/1999 | Fujiwara et al. | 365/185.02 |
| 6,060,743 | 5/2000 | Sugiyama et al. | 257/321 |
| 6,090,666 | 7/2000 | Ueda et al. | 438/257 |
| 6,140,181 * | 10/2000 | Forbes et al. | 438/257 |

OTHER PUBLICATIONS

Martino Lorenzini et al., "A Dual Gate Flash EEPROM Cell with Two–Bit Storage Capacity", IEEE Transactions On Components, Packaging, and Manufacturing Tech., Part A, vol. 20, No. 2, Jun. 1997, pp. 182–189.

Boaz Eitan et al., "Multilevel Flash cells and their Trade–offs", 1996, IEEE–IEDM, pp. 169–172.

\* cited by examiner

Primary Examiner—Son Mai
(74) Attorney, Agent, or Firm—Robert A. Rodriguez

(57) ABSTRACT

A method of operating a semiconductor device that includes a first memory cell with discontinuous storage elements or dots (108) in lieu of a conventional floating gate can be programmed to at least one of three different states. The different states are possible because the read current for the memory cell is different when the dots are programmed near the source region or near the drain region. Embodiments may use two different potentials for power supplies or three different potentials. The two-potential embodiment simplifies the design, whereas the three-potential embodiment has a reduced risk of disturb problems in adjacent unselected memory cells (100B, 100C, and 100D).

7 Claims, 2 Drawing Sheets

|        | 11        | 01        | 10        | 00        |
|--------|-----------|-----------|-----------|-----------|
| S1     | 0         | $V_{PP}$  | 0         | $V_{PP}$  |
| D1     | 0         | 0         | $V_{PP}$  | $V_{PP}$  |
| W1     | $V_{PP}$  | $V_{PP}$  | $V_{PP}$  | 0         |
| WELL 62| 0         | 0         | 0         | $V_{PP}$  |
| S2     | $V_{PP}$  | $V_{PP}$  | $V_{PP}$  | $V_{PP}$  |
| D2     | $V_{PP}$  | $V_{PP}$  | $V_{PP}$  | $V_{PP}$  |
| W2     | 0         | 0         | 0         | 0         |
| WELL 64| $V_{PP}$  | $V_{PP}$  | $V_{PP}$  | $V_{PP}$  |

|        | 11          | 01          | 10          | 00          |
|--------|-------------|-------------|-------------|-------------|
| S1     | $-V_{PP}/2$ | $+V_{PP}/2$ | $-V_{PP}/2$ | $+V_{PP}/2$ |
| D1     | $-V_{PP}/2$ | $-V_{PP}/2$ | $+V_{PP}/2$ | $+V_{PP}/2$ |
| W1     | $+V_{PP}/2$ | $+V_{PP}/2$ | $+V_{PP}/2$ | $-V_{PP}/2$ |
| WELL 62| $-V_{PP}/2$ | $-V_{PP}/2$ | $-V_{PP}/2$ | $+V_{PP}/2$ |
| S2     | 0           | 0           | 0           | $+V_{PP}/2$ |
| D2     | 0           | 0           | 0           | $+V_{PP}/2$ |
| W2     | 0           | 0           | 0           | $-V_{PP}/2$ |
| WELL 64| 0           | 0           | 0           | $+V_{PP}/2$ |

METHOD OF OPERATING A SEMICONDUCTOR DEVICE

This application is a continuation of U.S. patent application Ser. No. 09/495,354 filed Feb. 1, 2000.

FIELD OF THE INVENTION

This invention is generally related to the field of semiconductor memories and more particularly to the programming of non-volatile memories to achieve a multi-state memory cell.

RELATED ART

Non-volatile memories including flash memories are well known in the field of semiconductor memory devices. In a conventional flash memory device, a single continuous floating gate structure is used for each memory cell. The single continuous floating gate structure is programmed and erased using programming and erase voltages and timings well known in the field. A conventional floating memory gate cell typically exists in one of two states representing either a logical zero or a logical one. To increase the capacity of a memory device without significantly increasing the size of the memory, it is desirable to implement a memory cell capable of representing more than two states. Non-volatile memory cells of this type, referred to throughout this disclosure as multi-state memory cells, have been historically implemented by controlling the amount of charge that is injected into the floating gate.

The reliability of multi-state memory cells is susceptible to defects in the dielectric structure between the floating gate and the substrate. More specifically, because the heavily doped continuous floating gate in a conventional memory device is conductive, a single defect in the form of a charge trap in the vicinity of the floating gate can drain all of the charge stored on the floating gate thereby undesirably erasing the corresponding memory cell. In addition, controlling the amount of injected charge can be a difficult process to control in a manufacturing environment thereby making it difficult to produce memory devices with consistently reliable programming voltages and programming times.

Moreover, conventional flash memory technologies are limited by the thickness of the tunnel oxide. Because the minimum tunnel oxide thickness cannot be effectively reduced below 5–7 nanometers without incurring significant leakage, the programming voltage required to sufficiently charge the floating gate structure must be maintained in the range of approximately 10–15 volts. To produce a programming voltage of this magnitude, it is necessary to incorporate a multi-stage charge pump and other high voltage circuitry into the design of conventional flash memory devices. The relative size of this high voltage circuitry effectively limits the scaling of the die size that can be achieved by simply scaling the size of the memory cell. Therefore, it is highly desirable to implement a non-volatile memory device with a multi-state memory cell without requiring a programming voltage significantly in excess of the operating voltage with a reliable manufacturing process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

A method of operating a semiconductor device incorporating discontinuous storage elements or "dots" in lieu of a floating gate structure of conventional flash memory devices. Through selective charging of the dots, a first memory cell of the semiconductor device can be programmed to one of at least three different states. By providing a programming method and cell structure for enabling a single storage cell to store more than two states, the memory capacity of the semiconductor device can be effectively increased without increasing the physical size of the device. In addition, the use of discontinuous storage elements reduces problems associated with defects in the dielectric between the dots and the device substrate thereby resulting in improved performance over a conventional continuous floating gate memory.

Figure 1:
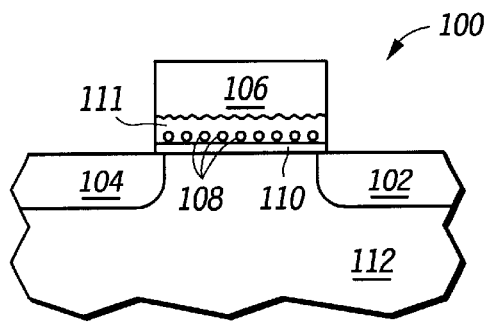
FIG. 1 includes a simplified cross-sectional view of a non-volatile memory cell in an uncharged state according to one embodiment of the present invention.

FIG. 1 depicts a partial cross-sectional view of a memory cell 100 according to one embodiment of the present invention. Memory cell 100 includes a first conductive electrode (drain region) 104 and a second conductive electrode (source region) 102 disposed on either side of a control electrode (control gate electrode) 106. Source 102 and drain 104 are fabricated within a substrate 112 comprised, in a typical embodiment, of monocrystalline silicon or other suitable semiconductor material. In one embodiment, each of the source regions 102 and drain regions 104 are doped with an n-type impurity including phosphorous, arsenic, or the like, and substrate 112 is doped with a p-type impurity, such as boron. In another embodiment, source regions 102 and drain regions 104 are p-type while substrate 112 is n-type.

Memory cell 100 further includes discontinuous storage elements (dots) 108 vertically disposed between gate 106 and substrate 112 and laterally disposed between source region 102 and drain region 104. The composition of dots 108 is suitable for trapping charged particles to effect a threshold voltage shift for memory cell 100. In this manner, dots, also called nanocrystals, are analogous to and replace the single continuous floating gate in conventional non-volatile memories.

In one embodiment, dots 108 are comprised of silicon, germanium, or other suitable material. The density of dots 108 is substantially greater than the density of defects in oxide 110. Dot densities of approximately 5E11 $cm^{-2}$ are suitable for use with conventional fabrication processes. If the dots overlie an area that is 0.1 micron by 0.1 micron, the area will typically be covered by approximately 50 dots. Even if dimensions shrink, there will typically be at least approximately five dots for a memory structure. The size of the dots 108 in one embodiment is in the vicinity of approximately 3 to 10 nanometers in diameter. In one embodiment, dots 108 reside above an upper surface of substrate 112 by a distance of less than approximately five nanometers. In the depicted embodiment, dots 108 reside on a first dielectric layer 110 comprised of, in one embodiment, a thermally formed oxide. A second dielectric layer 111 resides on dots 108 and first dielectric layer 110. A thickness of first oxide layer 110 is typically less than five nanometers and is still more typically in the range of approximately 3 to 3.5 nanometers. By displacing dots 108 above the upper surface of substrate 112 by approximately 3 nanometers, programming voltages required to program memory cell 100 are significantly less than programming voltages required to program conventional flash memory devices with tunnel oxide thicknesses of at least 5 nanometers. In addition, by providing dots 108 in place of a continuous floating gate structure, the ability of any single defect in oxide 110 to drain charge is limited to the charge stored on dots in close proximity to the defect itself Because the numbers of dots 108 is greatly in excess of the number of defects in first dielectric 110, charge leakage is low and charge retention is high relative to conventional floating gate devices.

Figure 2:
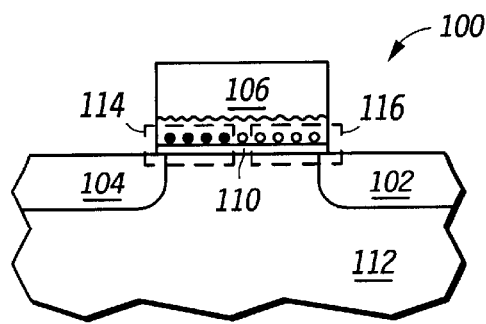
FIG. 2 includes a cross-section of the storage device of FIG. 1 in which discontinuous storage elements in the vicinity of a first conductive electrode have been selectively charged.
Figure 3:
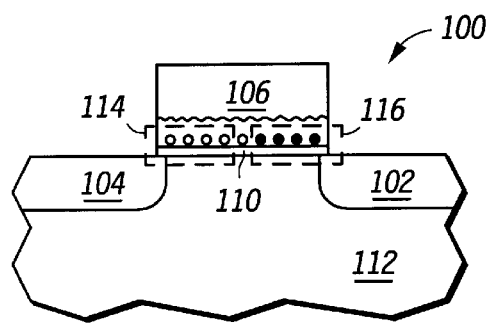
FIG. 3 includes a partial cross-sectional view of the memory cell of FIG. 1 in which discontinuous storage elements in the vicinity of a second conductive electrode have been selectively charged.
Figure 4:
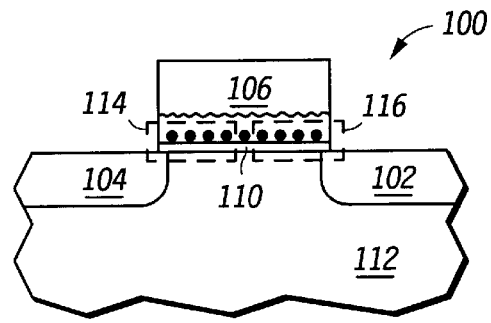
FIG. 4 includes a partial cross-sectional view of the storage element of FIG. 1 in which substantially all of the discontinuous storage elements have been charged.

FIGS. 1–4 depict four states in which memory cell 100 may programmed depending upon the programming voltages applied to the terminals of cell 100. Each of four sets of programming voltages applied to memory cell 100 results in a corresponding spatial distribution of dots 108 that are charged. The various spatial distributions of charged dots 108 result in corresponding threshold voltage shifts that produce detectable differences in drain current for the same biasing conditions. In FIG. 1, substantially all of the discontinuous storage elements 108 are uncharged. By controlling the application of programming voltages to memory device 100, dots 108 may be selectively charged. In FIG. 2, dots 108 in a region 114 proximal to drain region 104 are charged while dots 108 in region 116 proximal to source region 102 are uncharged. In FIG. 3, dots 108 in region 116 proximal to source region 102 are charged while dots 108 in region 114 proximal to drain region 104 are unchanged. FIG. 4 depicts a situation in which substantially all dots 108 are charged.

Figure 5:
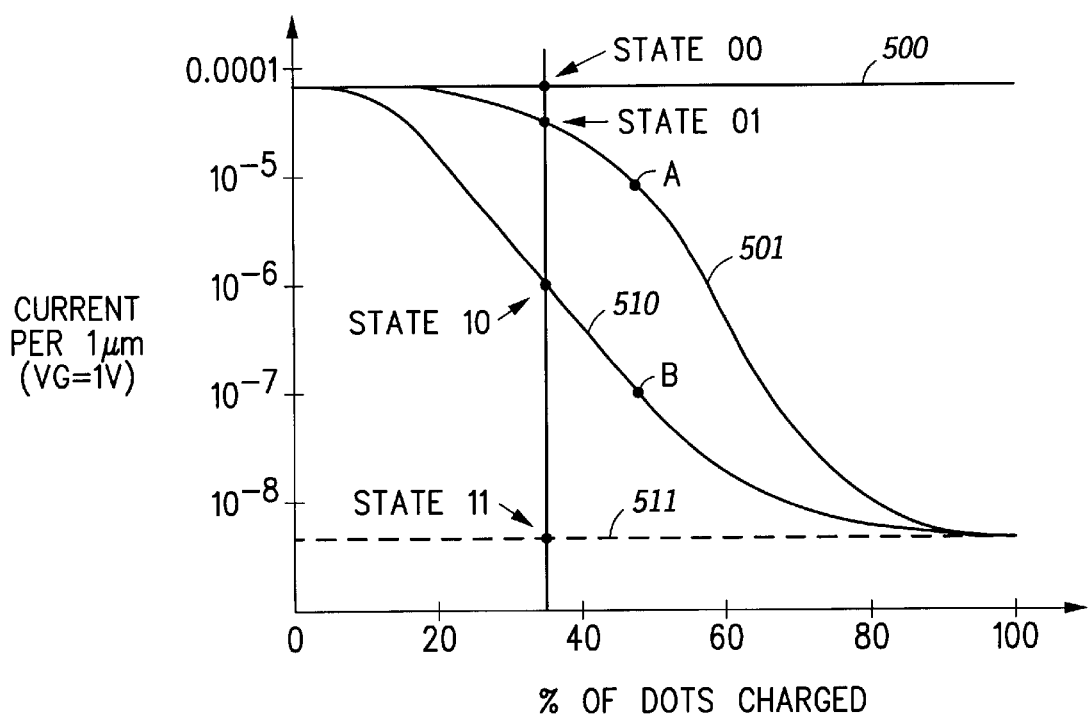
FIG. 5 includes a graph indicating drain current as a function of the ratio of discontinuous storage elements that have been charged.

Each of these four distributions of charged dots 108 is associated with a corresponding threshold voltage that is detectable by measuring the cell's drain current. Referring to FIG. 5, the four values of drain current corresponding to the four dot distributions depicted in FIGS. 1–4 are depicted for a specified biasing condition. Trace 500 represents a boundary line indicating the drain current that is produced in memory cell 100 when substantially all of the dots 108 are uncharged as in FIG. 1. Trace 511 indicates a boundary line corresponding to the situation depicted in FIG. 4 in which substantially all of the dots 108 are charged. Trace 501 indicates the drain current as a function of the percentage of dots 108 that are charged proceeding in a direction from drain to source. As an example, at point A of trace 501 where approximately 50% of dots 108 are charged, substantially all of the dots in region 114 proximal to drain region 104 are charged while substantially none of the dots 108 in region 116 proximal to source region 102 are charged. Trace 510 indicates drain current as a function of the percentage of discontinuous storage elements 108 that are charged proceeding in a direction from source region to drain region such that, for example, at point B where 50% of dots 108 are charged, substantially all dots 108 in region 116 proximal to source region 102 are charged while substantially all of the dots in region 114 proximal to drain region 104 are uncharged.

FIG. 5 further indicates four states, namely, state 00, state 01, state 10, and state 11 corresponding to the charged dot distributions of FIGS. 1–4, respectively. These four states demonstrate that differences in drain current are detectable when the percentage of dots charged for state 10 and state 01 is in the range of approximately 30–35% proximal to the source region 102 and drain region 104, respectively. Thus, by selectively charging approximately 30–50% of the dots (for state 10 and state 01), the output current produced by memory cell 100 changes by an order of magnitude or greater from the "adjacent" state. An appropriately configured circuit can detect each of the four states to convey two bits of information. In this fashion, the capacity of a single memory cell 100 is doubled without an increase in cell size.

Figures 6, 7, 8:
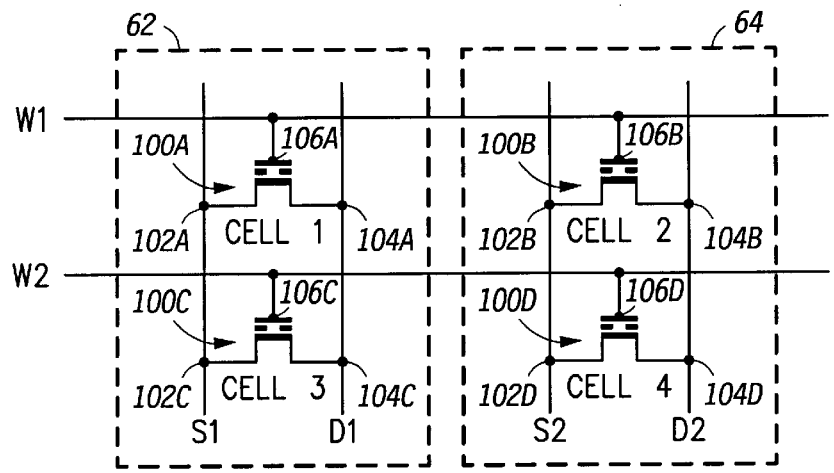
FIG. 6 illustrates an architecture of a memory cell array suitable for use with one embodiment of the present invention.
FIG. 7 includes a programming voltage table for the memory cell array of FIG. 6 according to one embodiment of the invention utilizing two programming potentials.
FIG. 8 includes a programming voltage table for the memory cell array of FIG. 6 according to one embodiment of the invention utilizing three programming potentials.

FIG. 6 includes an illustration of a portion of a memory array that includes first memory cell 100A, second memory cell 100B, third memory cell 100C, and fourth memory cell 100D. First and second memory cells 100A and 100B lie along word line W1. Portions of the word line W1 includes the control gate electrodes 106A and 106B of memory cells 100A and 100B, respectively. Similarly, word line W2 includes the control gate electrodes 106C and 106D of the third and fourth memory cells 100C and 100D, respectively. First and third memory cells 100A and 100C share a common source line S1 that is electrically connected to source terminals 102A and 102C. Similarly, first and third memory cells 100A and 100C share a common drain line D1 that is electrically connected to drain terminals 104A and 104C, respectfully. A second source line S2 electrically connects source signals 102B and 102D of second and fourth memory cells 100B and 100D while a second drain line D2 is electrically connected to drain terminals 104B and 104D respectively. First and third memory cells 100A and 100C have active regions (source regions, drain regions, and channel regions) that lie within well region 62 while second and fourth memory cells 100B and 100D have active regions (source regions, drain regions, and channel regions) that lie within well region 64. Well regions 62 and 64 correspond to substrate 112 of the memory cell 100 as shown in FIGS. 1–4.

The operation of memory cell 100A, without significantly disturbing the data within memory cells 100B, 100C, and 100D, will now be addressed with respect to the voltage tables of FIG. 7 and FIG. 8. The voltage programming table of FIG. 7 is suitable for use in an embodiment of the invention in which two potentials, namely, a first potential ($V_{pp}$) and a second potential ($V_{ss}$, which is approximately 0 volts) are available for programming purposes. In one embodiment, the difference between first potential $V_{pp}$ and the second potential $V_{ss}$ is no greater than approximately 5 volts.

In one embodiment, any of the four states indicated in FIGS. 1–4 may be achieved in memory cell 100A by applying the voltages as indicated in the four columns of FIG. 7 without significantly disturbing the contents of remaining memory cells 100B, 100C, and 100D. More specifically, first memory cell 100A may be transitioned from the "00" state to the 01, 10, or 11 states by applying the indicated programming voltages for the required programming duration. Programming times are typically in a range of approximately 1 microsec and 10 msec. In addition, first memory cell 100A may be erased or transitioned from states 01, 10, and 11 to state 00 by applying the voltages indicated in column 00 for the required erase duration.

As indicted in FIG. 7, a "00" state (i.e., the erased state) is achieved by applying the first potential $V_{pp}$ to source and drain 102A and 104A (via lines S1 and D1, respectively), maintaining well region 62 at the first potential $V_{pp}$, and maintaining W1 at the second potential $V_{ss}$. With voltages applied in this manner, the charge on dots 108A of first memory cell 100A is eliminated or erased leaving substantially all of the dots in an uncharged state. The 00 state results in the lowest (absolute value) threshold voltage and the highest current of the four states. Lines S2, D2, and well region 64 are maintained at the first potential $V_{pp}$, and word line W2 is maintained at the second potential $V_{ss}$. Under these biasing conditions, all of the memory cells 100A, 100B, 100C, and 100D are erased during this block erase operations.

In another embodiment, only the memory cells along the same word line can be erased to provide a row or column erase. Turning specifically to FIG. 6, memory cells 100A and 100B can be erased without significantly disturbing the data with memory cells 100C and 100D. In this embodiment, the biasing conditions for state "00" in FIG. 7 would be used, except that word line W2 would be maintained at the first potential $V_{pp}$.

The state of first memory cell 100A depicted in FIG. 2 in which discontinuous storage elements 108 in region 114 proximal to drain terminal 104A are charged is produced, as indicated in column 01 of FIG. 7 by applying the first potential $V_{pp}$ to word line W1 and source line S1 while maintaining the well region 62 and drain line D1 at the second potential $V_{ss}$. The application of a voltage differential between control gate 106A and drain 104A of first memory cell 100A produces an electric field that induces electrons in the drain (or electrons in the vicinity of the drain) to transfer to dots 108 in the vicinity of drain 104A. Maintaining source 102A of the first memory cell 100A at substantially the same potential as control gate 106A prevents significant charging of dots 108 in the vicinity of source 102A thereby producing the distribution of charged dots depicted in FIG. 2. This distribution of charged dots 108 results in a drain current represented by trace 501 of FIG. 5.

To achieve the state represented in column 10 of FIG. 7, in which dots 108 in region 116 in the vicinity of source 102A are substantially all charged while dots in region 114 in the vicinity of drain 104A are substantially uncharged (FIG. 3), is produced by applying a voltage potential between control gate 106A and source 102A while maintaining drain 104A at substantially the same potential as the control gate 106A. The voltage potential between source 102A and control gate 106A transfers electrons from source 102A to dots 108 in the vicinity of source 102A while maintaining drain 104A at the potential of control gate 106A substantially prevents the transfer of electrons from drain 104 to dots 108, thereby resulting in selective charging of dots 108 in the vicinity of source 102. This selective distribution of charged dots results in a current indicated by trace 510 of FIG. 5 in which the drain current is substantially less than the drain current of trace 501 for the same percentage of dots 108 that are charged. Thus, FIG. 5 emphasizes the dependence of the drain current in memory cell 100 on the spatial distribution (location) of charged elements in dots 108.

The charged distribution depicted in FIG. 4 is achieved by applying the programming voltages indicated by column 11 of FIG. 7 in which a voltage potential is applied between control gate 106A and drain 104A as well as between control gate 106A and source 102A by applying the first potential $V_{pp}$ to control gate 106A (via word line W1) while applying second potential $V_{ss}$ to source 102A (via S1), drain 104A (via D1), while maintaining well region 62 at the second potential $V_{ss}$. In this configuration, an electric field exists between control terminal 106A and each of the source 102A and the drain 104A and well region 62 resulting in transfers of electron from source 102A and drain 104A to dots 108 in the vicinity of both source 102A and drain 104A. Referring again to FIG. 5, trace 511, which is representative of the charged distribution indicated in FIG. 4 indicates an extremely low drain current relative to the drain current of traces 501 and 510.

When programming to states 01, 10, and 11, the remaining rows of FIG. 7, indicating voltages for S2, D2, W2 and well region 64 are included to emphasize that second, third, and fourth memory cells 100B, 100C, and 100D are substantially unaffected by the programming of first memory cell 100A. More specifically, in each programming column of FIG. 7 (i.e., columns 01, 10, and 11), the source line S2 and drain line D2 that are applied to sources and drains of second and fourth memory cells 100B and 100D, respectively, are maintained at the potential of word line W1. In the case of second memory cell 100B, this configuration results in the application of no significant bias between control gate 106B and source 102B as well as no significant bias between control gate 106B and drain 104B thereby preventing a significant alteration in the percentage of dots 108 of second memory cell 100B that are charged. With respect to fourth memory cell 100D, the application of second potential $V_{ss}$ to word line W2 while maintaining source and drain 102D and 104D at the first potential $V_{pp}$ results in a bias that is suitable for erasing or removing charge from dots 108. Because, however, the programming time is orders of magnitude less than the time required to erase or remove charge from dots 108, fourth memory cell 100D remains substantially unchanged during the programming of first memory cell 100A. Similarly, programming of third memory cell 100C is prevented by maintaining second word line W2 at second potential $V_{ss}$ during the programming of memory cell 100A such that any potential applied to either source line S1 or drain line D1 results in only a slight erasing of third memory cell 100C that is generally considered insignificant.

Reading of memory cell 100A can be performed by placing the source line S1 at the first potential $V_{ss}$, the drain line D1 at approximately 1 volt, and the word line W1 at approximately $V_{DD}$, which is typically less than approximately 2 volts. The source line S2 and drain line D2 are at approximately the same voltage potential (e.g., zero volts), and the word line W2 is typically approximately zero volts to reduce the likelihood of disturbing the date within memory cells 100B, 100C, and 100D. The well regions 62 and 64 are typically at the approximately the same potential as the source lines S1 and S2, respectively.

The programming voltages indicated in FIG. 7 require only two potential signals, namely, a $V_{pp}$ signal and a $V_{ss}$ signal. This embodiment of the invention enjoys the advantage of requiring only a single programming power supply. However, more than two power supply potentials can be used in another embodiment. The programming voltages indicated in FIG. 8, utilize first, second, and third potentials, namely, a $+V_{pp}/2$ signal, a $V_{ss}$ signal, and a $-V_{pp}/2$ signal. While this embodiment requires an additional programming voltage level, the reduced magnitude of the programming voltages applied across the memory cells not being programmed results in a lower likelihood of disturbing the contents of these memory cells.

Programming of memory cell 100A using three potentials is achieved as indicated in FIG. 8. The three potentials include a first potential $+V_{pp}/2$, a third potential $-V_{pp}/2$, and a second potential $V_{ss}$, intermediate between the first and third potentials. In one embodiment, the difference between the first and third potentials is less than approximately 5 volts. To program memory cell 100A to a 00 state (i.e., erase state), the first potential $+V_{pp}/2$ is applied to the source line S1, drain line D1, and well region 62 while applying the third potential $-V_{pp}/2$ to the word line W1. Lines S2, D2, and well region 64 are maintained at the first potential $+V_{pp}/2$, and word line W2 is maintained at the third potential $-V_{pp}/2$. Under these biasing conditions, all of the memory cells 100A, 100B, 100C, and 100D are erased during this block erase operations.

In another embodiment, only the memory cells along the same word line can be erased to provide a row or column erase. Turning specifically to FIG. 6, memory cells 100A and 100B can be erased without significantly disturbing the data with memory cells 100C and 100D. In this embodiment, the biasing conditions for state "00" in FIG. 8 would be used, except that word line W2 would be maintained at the first potential $+V_{pp}/2$.

To program the memory cell to a 01 state, the first potential is applied to S1 and W1, and the third potential applied to D1 well region 62. To program memory cell to the 10 state, the third potential $-V_{pp}/2$ is applied to S1 and well region 62 while the first potential $+V_{pp}/2$ is applied to D1 and W1. The 11 state is programmed by applying the first potential $+V_{pp}/2$ to W1 and the third potential to S1, D1, and well region 62. In the three potential embodiment, the potentials of S2, D2, W2, and well region 64, which affect second, third, and fourth memory cells 100B, 100C, and 100D, which are non-selected memory cells are maintained at the second potential $V_{ss}$ during programming of first memory cell 100A to the 11, 10, and 01 states. Thus, in the three potential embodiment, the worst case bias applied across any junction of the second, third, and fourth memory cells 100B, 100C, and 100D is $V_{pp}/2$ thereby beneficially reducing the likelihood of a unintentionally disturbing a neighboring cell when programming first cell 100A.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of operating a semiconductor device including a first memory cell, the method comprising:
   providing the semiconductor device, wherein a first memory cell has discontinuous storage elements; and
   programming the first memory cell to a first state, which is one of at least three different states, wherein programming is performed using a first potential and a second potential, wherein a difference between the first and second potentials is no greater than approximately 5 volts; and
   programming further includes:
      biasing the first current carrying electrode and the control electrode to the first potential; and
      biasing the second current carrying electrode and the substrate to the second potential; and
   wherein the first memory cell includes:
      a substrate;
      a first current carrying electrode within the substrate;
      a second current carrying electrode within the substrate and spaced apart from the first current carrying electrode;
      a first dielectric layer having a first side and a second side that is opposite the first side, wherein the substrate lies along the first side of the first dielectric layer and the discontinuous storage elements lie along the second side of the first dielectric layer;
      a second dielectric layer having a first side and a second side that is opposite the first side, wherein the first dielectric layer and the discontinuous storage elements lie along the first side of the second dielectric layer; and
      a control electrode lies along the second side of the second dielectric layer.

2. The method of claim 1, further comprising reprogramming the first memory cell to a second state, wherein programming further includes:
   biasing the first current carrying electrode, the second current carrying electrode, and substrate to the first potential; and
   biasing the control electrode to the second potential.

3. The method of claim 2, further comprising reprogramming the first memory cell to a third state, wherein programming further includes:
   biasing the first current carrying electrode, the second current carrying electrode, and substrate to the second potential; and
   biasing the control electrode to the first potential.

4. A method of operating a semiconductor device including a first memory cell, the method comprising:
   providing the semiconductor device, wherein a first memory cell has discontinuous storage elements; and
   programming the first memory cell to a first state, which is one of at least three different states; and
   wherein an average spacing between the discontinuous storage elements is no less than approximately three nanometers.

5. A method of operating a semiconductor device including a first memory cell, comprising:
   providing the semiconductor device, wherein the first memory cell has discontinuous storage elements, a source region and a drain region; and
   programming a first portion of the discontinuous storage elements, wherein the first portion is proximal to the source region or the drain region.

6. The method of claim 5, wherein the discontinuous storage elements in the first portion are adjacent to each other.

7. The method of claim 5, wherein the first portion further comprises 30 to 50 percent of the discontinuous storage elements.

* * * * *